(12) United States Patent
Saito et al.

(10) Patent No.: US 8,933,444 B2
(45) Date of Patent: Jan. 13, 2015

(54) DISPLAY DEVICE

(71) Applicants: Nobuyoshi Saito, Tokyo (JP); Kentaro Miura, Kanagawa-ken (JP); Shintaro Nakano, Kanagawa-ken (JP); Tatsunori Sakano, Tokyo (JP); Tomomasa Ueda, Kanagawa-ken (JP); Hajime Yamaguchi, Kanagawa-ken (JP)

(72) Inventors: Nobuyoshi Saito, Tokyo (JP); Kentaro Miura, Kanagawa-ken (JP); Shintaro Nakano, Kanagawa-ken (JP); Tatsunori Sakano, Tokyo (JP); Tomomasa Ueda, Kanagawa-ken (JP); Hajime Yamaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/724,294

(22) Filed: Dec. 21, 2012

(65) Prior Publication Data

US 2013/0313545 A1 Nov. 28, 2013

(30) Foreign Application Priority Data

May 24, 2012 (JP) .................................. 2012-118789

(51) Int. Cl.
*H01L 51/52* (2006.01)
*H01L 27/32* (2006.01)
*H01L 29/786* (2006.01)

(52) U.S. Cl.
CPC ........ *H01L 51/5203* (2013.01); *H01L 27/3262* (2013.01); *H01L 29/7869* (2013.01)
USPC .......................................................... 257/43

(58) Field of Classification Search
CPC ... H01L 31/036; H01L 51/0072; H01L 51/52; H01L 21/34; H01L 29/04; H01L 29/786; H05B 33/22; H05B 33/10
USPC .......................................................... 257/43
See application file for complete search history.

(56) References Cited

U.S. PATENT DOCUMENTS 6,980,262 B2 12/2005 Song
2007/0114532 A1* 5/2007 Yamazaki et al. ............... 257/59

FOREIGN PATENT DOCUMENTS

| JP | 9-36369 | 2/1997 |
| JP | 2010-32642 | 2/2010 |
| JP | 2010-219506 | 9/2010 |
| JP | 2011-243972 | 12/2011 |
| KR | 10-2004-0062190 A | 7/2004 |
| KR | 10-0611650 B1 | 8/2006 |

OTHER PUBLICATIONS

Office Action issued Jan. 28, 2014 in Korean Patent Application No. 10-2013-0016807 (with English translation).
Office Action issued Jul. 11, 2014 in Japanese Patent Application No. 2012-118789 (with English translation ).

* cited by examiner

*Primary Examiner* — Fernando L Toledo
*Assistant Examiner* — Lawrence-Linh T Nguyen
(74) *Attorney, Agent, or Firm* — Oblon, Spivak, McClelland, Maier & Neustadt, L.L.P.

(57) ABSTRACT

According to one embodiment, a display device includes a substrate, a thin film transistor, a passivation film, a hydrogen barrier film, a pixel electrode, an organic light emitting layer, an opposite electrode, and a sealing film. The thin film transistor is provided on a major surface of the substrate. The thin film transistor includes a gate electrode, a gate insulating film, a semiconductor film, a first conducting portion, and a second conducting portion. The passivation film is provided on the thin film transistor. The hydrogen barrier film is provided on the passivation film. The pixel electrode is electrically connected to one of the first conducting portion and the second conducting portion. The organic light emitting layer is provided on the pixel electrode. The opposite electrode is provided on the organic light emitting layer. The sealing film is provided on the hydrogen barrier film and the opposite electrode.

19 Claims, 8 Drawing Sheets

DISPLAY DEVICE

CROSS-REFERENCE TO RELATED APPLICATIONS

This application is based upon and claims the benefit of priority from the prior Japanese Patent Application No. 2012-118789, filed on May 24, 2012; the entire contents of which are incorporated herein by reference.

FIELD

Embodiments described herein relate generally to a display device.

BACKGROUND

There is an active matrix display device in which a switching element such as a thin film transistor controls a current passing through an organic EL (Electro-Luminescent) device. It is desired to improve image quality in this display device.

DETAILED DESCRIPTION

Figure 1:
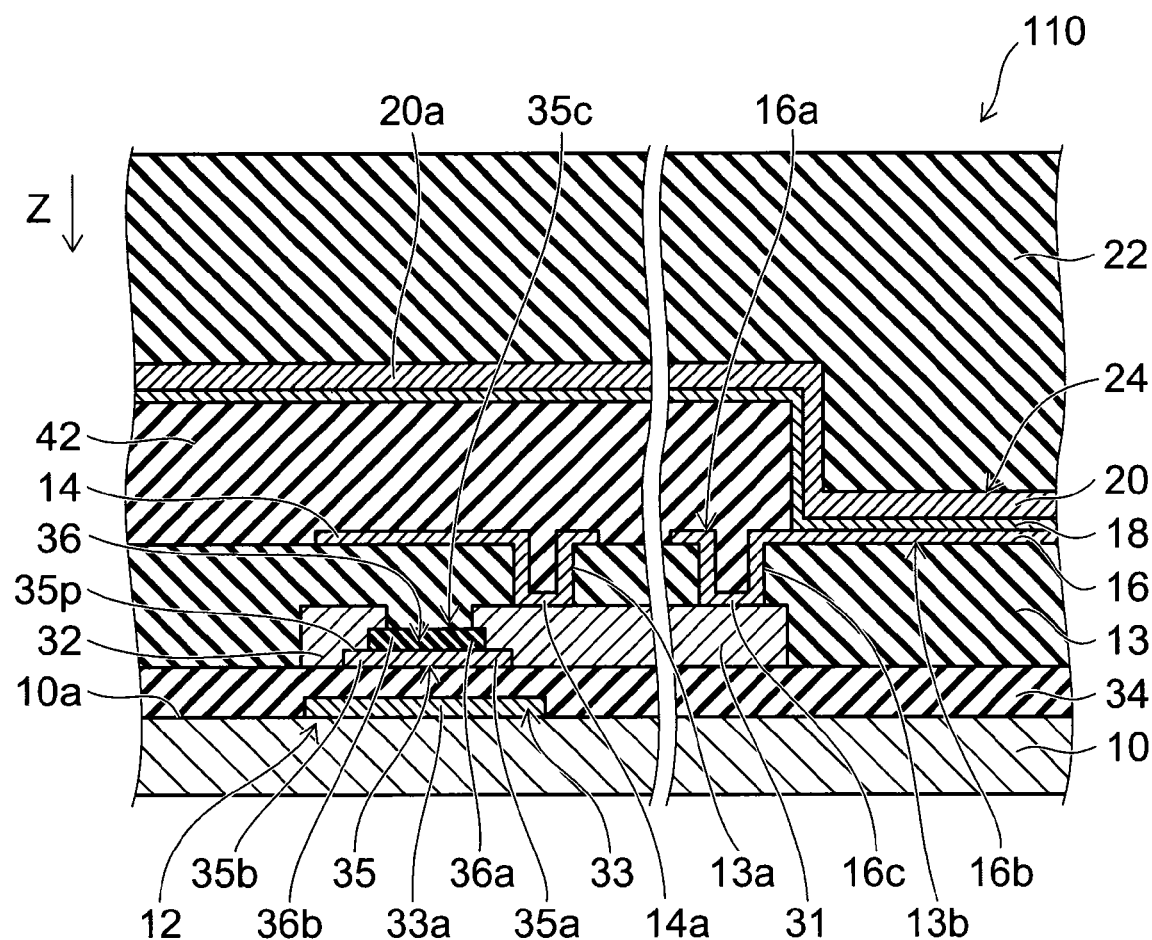
FIG. 1 is a schematic cross-sectional view illustrating the configuration of a display device according to a first embodiment.

According to one embodiment, a display device includes a substrate, a thin film transistor, a passivation film, a hydrogen barrier film, a pixel electrode, an organic light emitting layer, an opposite electrode, and a sealing film. The substrate has a major surface. The substrate is light transmissive. The thin film transistor is provided on the major surface. The thin film transistor includes a gate electrode, a gate insulating film, a semiconductor film, a first conducting portion, and a second conducting portion. The gate electrode is provided on the major surface. The gate insulating film is provided on the gate electrode. The semiconductor film is provided on the gate insulating film. The semiconductor film includes a first region, a second region apart from the first region, and a third region provided between the first region and the second region. The first conducting portion is electrically connected to the first region. The second conducting portion is electrically connected to the second region. The second conducting portion is provided apart from the first conducting portion. The passivation film is provided on the thin film transistor. The passivation film is insulative. The hydrogen barrier film is provided on the passivation film. The hydrogen barrier film overlaps with the semiconductor film when projected onto a plane parallel with the major surface. The pixel electrode is electrically connected to one of the first conducting portion and the second conducting portion. The pixel electrode is light transmissive. The organic light emitting layer is provided on the pixel electrode. The opposite electrode is provided on the organic light emitting layer. The sealing film is provided on the hydrogen barrier film and the opposite electrode.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

FIG. 1 is a schematic cross-sectional view illustrating the configuration of a display device according to a first embodiment.

As shown in FIG. 1, a display device 110 according to the embodiment includes a substrate 10, a thin film transistor 12, a passivation film 13, a hydrogen barrier film 14, a pixel electrode 16, an organic light emitting layer 18, an opposite electrode 20, and a sealing film 22.

The pixel electrode 16, the organic light emitting layer 18, and the opposite electrode 20 form an organic EL light emitting element portion 24. In this example, the pixel electrode 16 is served as an anode and the opposite electrode 20 is served as a cathode. In the embodiment, the pixel electrode 16 may be served as a cathode and the opposite electrode 20 may be served as an anode. The light emission of the light emitting element portion 24 is driven by the thin film transistor 12. In the display device 110, the combinations of the thin film transistors 12 and the light emitting element portions 24 are disposed in a matrix configuration. The drive of the thin film transistors 12 and the light emission of the light emitting element portions 24 in association with the drive are controlled to display pictures. The display device 110 is an active matrix display device using an organic EL device.

The substrate 10 has a major surface 10a. A light transmissive material, for example, is used for the substrate 10. A glass material or a resin material, for example, is used for the substrate 10. A light transmissive and flexible material is used for the substrate 10. A resin material such as polyimide, for example, is used for the substrate 10.

The thin film transistor 12 is provided on a major surface 10a of the substrate 10.

The thin film transistor 12 includes a first conducting portion 31, a second conducting portion 32, a gate electrode 33, a gate insulating film 34, a semiconductor film 35, and a channel protection film 36.

The gate electrode 33 is provided on the major surface 10a of the substrate 10. A high melting point metal such as molybdenum tungsten (MoW), molybdenum tantalum (MoTa) and tungsten (W), for example, is used for the gate electrode 33.

The gate insulating film 34 is provided on the gate electrode 33. In this example, the gate insulating film 34 is provided on throughout the major surface 10*a* so as to cover the gate electrode 33. An insulative and light transmissive material, for example, is used for the gate insulating film 34. One of a silicon oxide film, a silicon nitride film, and a silicon oxynitride film, for example, is used for the gate insulating film 34.

The semiconductor film 35 is provided on the gate insulating film 34. The gate insulating film 34 is provided between the gate electrode 33 and the semiconductor film 35, and insulates the gate electrode 33 from the semiconductor film 35. An oxide semiconductor including at least one of In, Ga, and Zn, for example, is used for the semiconductor film 35. Namely, an In—Ga—Zn—O oxide semiconductor, an In—Ga—O oxide semiconductor, and an In—Zn—O oxide semiconductor, for example, are used for the semiconductor film 35. The semiconductor film 35 is of an n-type or of a p-type. In the following, in this example, the case will be described where the semiconductor film 35 is of an n-type.

The first conducting portion 31 is provided on the gate insulating film 34. A part of the first conducting portion 31 is provided on the semiconductor film 35, and contacts the semiconductor film 35. Consequently, the first conducting portion 31 is electrically connected to the semiconductor film 35. The second conducting portion 32 is provided on the gate insulating film 34. The second conducting portion 32 is disposed apart from the first conducting portion 31. A part of the second conducting portion 32 is provided on the semiconductor film 35, and contacts the semiconductor film 35. Consequently, the second conducting portion 32 is electrically connected to the semiconductor film 35. Ti, Al, Mo, and the like, for example, are used for the first conducting portion 31 and the second conducting portion 32. The first conducting portion 31 and the second conducting portion 32 may be a stacked body including at least one of Ti, Al and Mo, for example. The first conducting portion 31 is one of the source electrode and drain electrode of the thin film transistor 12. The second conducting portion 32 is the other of the source electrode and drain electrode of the thin film transistor 12. In the following, in this example, the case will be described where the first conducting portion 31 is the source electrode and the second conducting portion 32 is the drain electrode.

The channel protection film 36 is provided on the semiconductor film 35. The channel protection film 36 protects the semiconductor film 35. A silicon oxide film, for example, is used for the channel protection film 36.

The first conducting portion 31 covers a first portion 36*a* of the channel protection film 36. The second conducting portion 32 covers a second portion 36*b* of the channel protection film 36. The first conducting portion 31 covers a first region 35*a* of the semiconductor film 35. The second conducting portion 32 covers a second region 35*b* of the semiconductor film 35. The second region 35*b* is apart from the first region in a direction perpendicular to the major surface 10*a*. The semiconductor film 35 has a third region 35*c* provided between the first region and the second region. The third region 35*c* is not covered with the first conducting portion 31 and the second conducting portion 32. The gate electrode 33 has a portion 33*a* between the first conducting portion 31 and the second conducting portion 32 when seen in a direction perpendicular to a film surface 35*p* of the semiconductor film 35 (in the following, referred to as a Z-axis direction). Namely, the gate insulating film 34 is disposed between the gate electrode 33 and the third region 35*c* of the semiconductor film 35. The channel protection film 36 is provided at least on the third region 35*c*. When a voltage is applied to the gate electrode 33, a channel is generated in the semiconductor film 35 and a current passes between the first conducting portion 31 and the second conducting portion 32.

The passivation film 13 is provided on the thin film transistor 12. In this example, the passivation film 13 is provided on throughout the major surface 10*a*. The passivation film 13 covers the thin film transistor 12. The passivation film 13 is insulative. The passivation film 13 is also light transmissive. One of a silicon oxide film, a silicon nitride film, and a silicon oxynitride film, for example, is used for the passivation film 13.

The hydrogen barrier film 14 is provided on the passivation film 13. Namely, the passivation film 13 is provided between the thin film transistor 12 and the hydrogen barrier film 14. The hydrogen barrier film 14 overlaps with the semiconductor film 35 when projected onto a plane parallel with the major surface 10*a*. The hydrogen barrier film 14 covers the semiconductor film 35 through the passivation film 13. The hydrogen barrier film 14 covers at least the third region 35*c* in the semiconductor film 35. A conductive material with hydrogen barrier properties to suppress the penetration of hydrogen is used for the hydrogen barrier film 14. A metal material including one of Ti, Ta, TiN, and TaN, for example, is used for the hydrogen barrier film 14. An oxide including at least one of In, Zn, Ga, Ti, and Al, for example, is used for the hydrogen barrier film 14. For the oxide of the hydrogen barrier film 14, ITO (In—Ti—O), IZO (In—Zn—O), AZO (Al—Zn—O), IGZO (In—Ga—Zn—O), ZnO, and the like are used, for example.

The passivation film 13 is provided with a first opening 13*a* and a second opening 13*b*, and a part of the first conducting portion 31 is exposed from the first opening 13*a* and the second opening 13*b*. A part 14*a* of the hydrogen barrier film 14 contacts the first conducting portion 31 in the first opening 13*a*. Consequently, the hydrogen barrier film 14 is electrically connected to the first conducting portion 31.

The pixel electrode 16 is electrically connected to one of the first conducting portion 31 and the second conducting portion 32. In this example, the pixel electrode 16 is electrically connected to the first conducting portion 31.

The pixel electrode 16 is provided on the passivation film 13. The pixel electrode 16 has an opposing region 16*a* opposing the thin film transistor 12 and a non-opposing region 16*b* not opposing the thin film transistor 12 in the Z-axis direction. An electrically conductive and light transmissive material, for example, is used for the pixel electrode 16. ITO or the like, for example, is used for the pixel electrode 16. A part 16*c* of the opposing region 16*a* of the pixel electrode 16 contacts the first conducting portion 31 in the second opening 13*b*. Consequently, the pixel electrode 16 is electrically connected to the first conducting portion 31.

Consequently, the hydrogen barrier film 14 is electrically connected to the pixel electrode 16 through the first conducting portion 31. As described above, the hydrogen barrier film 14 is electrically connected to one of the first conducting portion 31 and the second conducting portion 32.

A planarization film 42 is provided on the hydrogen barrier film 14 and the opposing region 16*a* of the pixel electrode 16. An insulative material, for example, is used for the planarization film 42. One of a silicon oxide film, a silicon nitride film, and a silicon oxynitride film, for example, is used for the planarization film 42.

The organic light emitting layer 18 is provided on the non-opposing region 16*b* of the pixel electrode 16 and the planarization film 42. The organic light emitting layer 18 contacts the pixel electrode 16 in the non-opposing region 16b, for example. The planarization film 42 prevents the hydrogen barrier film 14 from contacting the organic light emitting layer 18, and prevents the opposing region 16a from contacting the organic light emitting layer 18. A stacked body having a hole transport layer, a light emitting layer, and an electron transport layer stacked on each other, for example, is used for the organic light emitting layer 18.

The opposite electrode 20 is provided on the organic light emitting layer 18. The opposite electrode 20 is provided on the planarization film 42, and has a portion 20a extending on the semiconductor film 35 and the hydrogen barrier film 14. A conductive material is used for the opposite electrode 20. Al, MgAg, or the like, for example, is used for the opposite electrode 20. The light emitting element portion 24 is formed in the non-opposing region 16b, for example. In the light emitting element portion 24, a voltage is applied across the pixel electrode 16 and the opposite electrode 20 to emit light from the organic light emitting layer 18. The light emitted from the organic light emitting layer 18 passes through the passivation film 13, the gate insulating film 34, and the substrate 10, and goes to the outside. The display device 110 is a lower surface emitting display device.

The sealing film 22 is provided on the opposite electrode 20. The sealing film 22 covers the organic light emitting layer 18 and the opposite electrode 20. The sealing film 22 covers the thin film transistor 12 and the hydrogen barrier film 14. The sealing film 22 protects the organic light emitting layer 18 and the opposite electrode 20. One of a silicon oxide film, a silicon nitride film, and a silicon oxynitride film, for example, is used for the sealing film 22. In the case of using these materials, the sealing film 22 includes hydrogen of $10^{19}$ atoms/cm$^3$ or more.

The hydrogen barrier film 14 suppresses hydrogen included in the sealing film 22 that reaches the semiconductor film 35 and adversely affects the performance of the thin film transistor 12.

Figure 2:
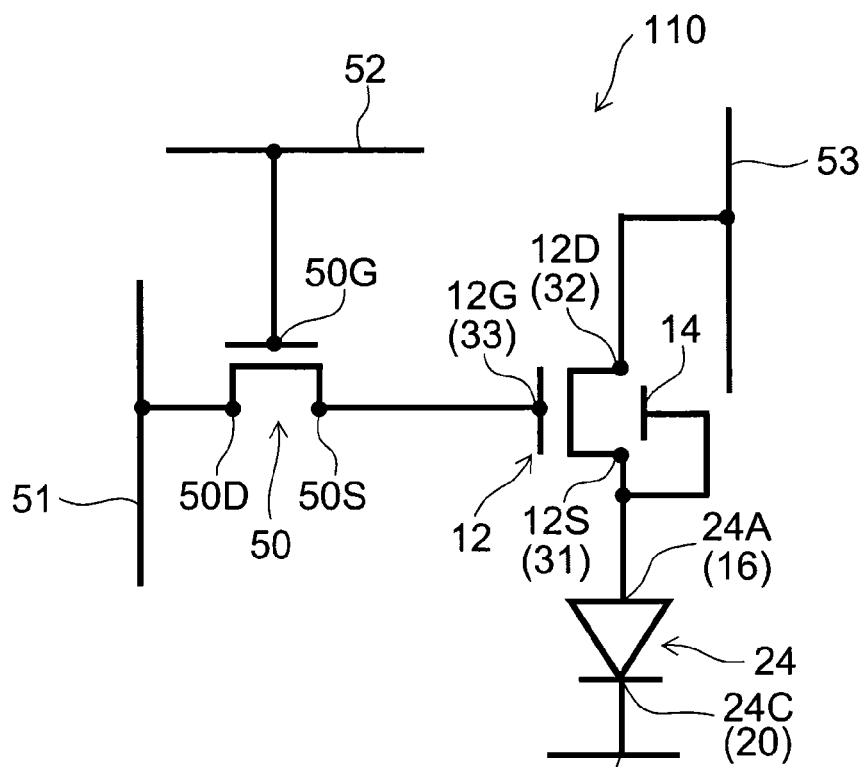
FIG. 2 is an equivalent circuit diagram illustrating the configuration of the display device according to the first embodiment.

FIG. 2 is an equivalent circuit diagram illustrating the configuration of the display device according to the first embodiment.

As shown in FIG. 2, the display device 110 includes the thin film transistor 12, the hydrogen barrier film 14, the light emitting element portion 24, a switch transistor 50, a signal line 51, a gate line 52, and a power supply line 53.

A source 12S (the first conducting portion 31) of the thin film transistor 12 is electrically connected to an anode 24A (the pixel electrode 16) of the light emitting element portion 24. A drain 12D (the second conducting portion 32) of the thin film transistor 12 is electrically connected to the power supply line 53 that supplies a supply voltage. A gate 12G (the gate electrode 33) of the thin film transistor 12 is electrically connected to a source 50S of the switch transistor 50.

An opposite electrode 24C (the opposite electrode 20) of the light emitting element portion 24 is connected to a common power supply 25 (a ground, for example). A drain 50D of the switch transistor 50 is electrically connected to the signal line 51. A gate 50G of the switch transistor 50 is electrically connected to the gate line 52.

The hydrogen barrier film 14 contacts the first conducting portion 31 through the part 14a, and is electrically connected to the source 12S of the thin film transistor 12 as described above. The hydrogen barrier film 14 is electrically connected to the anode 24A of the light emitting element portion 24 through the source 12S.

In the display device 110, a voltage is applied to the gate 50G of the switch transistor 50 through the gate line 52 to turn the switch transistor 50 in the ON state. A voltage is simultaneously applied to the signal line 51, and the voltage is applied to the gate 12G of the thin film transistor 12 through the signal line 51 and the switch transistor 50 in the ON state. Consequently, a current according to the voltage of the gate 12G passes through the light emitting element portion 24, and light is emitted from the light emitting element portion 24 at luminance according to the voltage of the gate 12G.

In the following, an exemplary deterioration in the performance of the thin film transistor 12 will be described.

Figure 3:
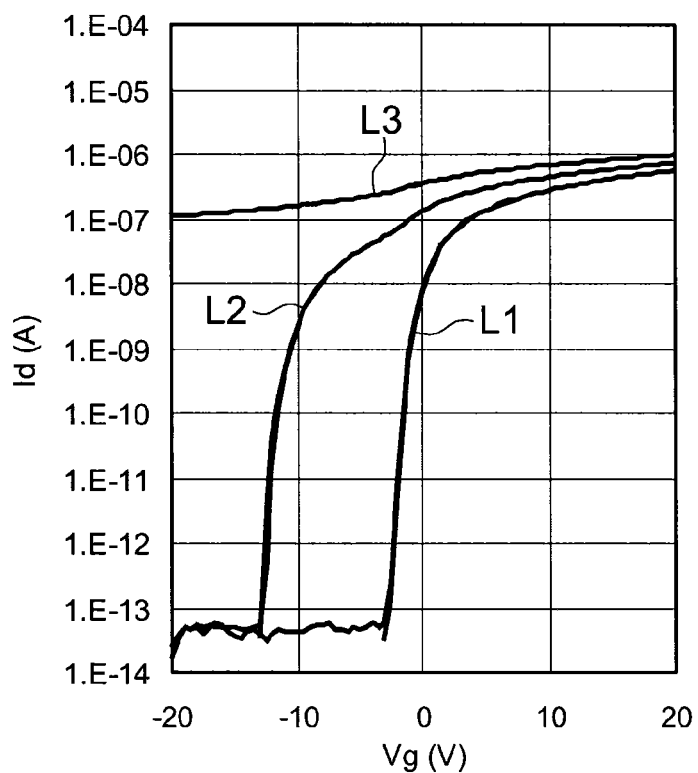
FIG. 3 is a graph illustrating the characteristics of a display device according to a reference sample.

FIG. 3 is a graph illustrating the characteristics of a display device according to a reference sample.

The horizontal axis in FIG. 3 represents a gate voltage Vg to be applied to the gate 12G of the thin film transistor 12. The vertical axis in FIG. 3 represents a current Id passing across the drain 12D and the source 12S of the thin film transistor 12.

A sample L1 shown in FIG. 3 is a sample in which the thin film transistor 12 was formed on the substrate 10 and the passivation film 13 was formed thereon. A sample L2 is a sample in which SiN was further formed on the sample L1 by PE-CVD (Plasma-Enhanced Chemical Vapor Deposition) as the sealing film 22. In the sample L2, the hydrogen barrier film 14 was not provided. A sample L3 is a sample in which the sample L2 was annealed at a temperature of 100° C. for one hour.

As shown in FIG. 3, in the sample L1, appropriate threshold characteristics are obtained in the thin film transistor 12. In the sample L2, the threshold voltage of the thin film transistor 12 is greatly shifted to the negative side. When annealing is performed as in the sample L3, the threshold voltage is reducing to turn into the normally on state.

From the comparison between the sample 1 and the sample L2, it can be considered that the shift of the threshold voltage is caused by the sealing film 22. Since a reduction in the resistance of the semiconductor film 35 further advances by annealing at a low temperature of about 100° C., it can be considered that a faulty mode occurs in which some impurity is diffused. More specifically, it can be considered that hydrogen included in the sealing film 22 is diffused to the lower side to deoxidize the IGZO film in the channel for a reduction in the resistance and the threshold voltage of the thin film transistor 12 fluctuates.

In an actual display device in which the thin film transistor 12 and the organic light emitting layer 18 are combined, the opposite electrode 20 including a metal material (Al, for example) is provided between the thin film transistor 12 and the sealing film 22. It is usually considered that hydrogen included in the sealing film 22 is blocked at the opposite electrode 20 and does not reach the semiconductor film 35 of the thin film transistor 12.

However, even in the case where the opposite electrode 20 is provided between the semiconductor film 35 and the sealing film 22, the shift of the threshold voltage is insufficiently suppressed. Namely, the opposite electrode 20 made of a metal material such as Al does not provide effect enough to block hydrogen in the sealing film 22.

On the contrary, in the configuration in which the hydrogen barrier film 14 with a low hydrogen permeability is formed on the thin film transistor 12 other than the opposite electrode 20 such as Al, the fluctuation of the threshold voltage is reduced after forming the sealing film 22.

In the display device 110 according to the embodiment provided with the hydrogen barrier film 14, the shift of the threshold voltage after annealed can be suppressed after forming the sealing film 22. Thereby, a high image quality can be obtained in the display device 110.

As described above, the hydrogen barrier film 14 with a low hydrogen permeability (that is, the hydrogen barrier properties are high) is provided to suppress the fluctuation of the threshold voltage.

Ti, Ta, TiN, TaN, and the like have a low hydrogen permeability. An oxide including at least one of In, Zn, Ga, Ti, and Al has a low hydrogen permeability. These materials are used for the hydrogen barrier film 14 to effectively suppress the fluctuation of the threshold voltage.

In the case of using a metal material including one of Ti, Ta, TiN, and TaN for the hydrogen barrier film 14, the thin film transistor 12 can be shielded from the light. Thereby, the characteristic variation (optical leakage) of the thin film transistor 12 caused by light incident to the thin film transistor 12 can be suppressed.

In the embodiment, the hydrogen barrier film 14 is electrically connected to the source 12S of the thin film transistor 12. Thereby, such an event that the hydrogen barrier film 14 provided on the thin film transistor 12 is charged and the thin film transistor 12 is turned into the ON state unintentionally can be suppressed, for example. A change in the characteristics of the thin film transistor 12 can also be suppressed, which is caused by the unnecessary back gate effect from the potential of the opposite electrode 24C of the light emitting element portion 24.

FIG. 4A to FIG. 4D are schematic cross-sectional views illustrating a method for manufacturing the display device according to the first embodiment.

Figure 4A:
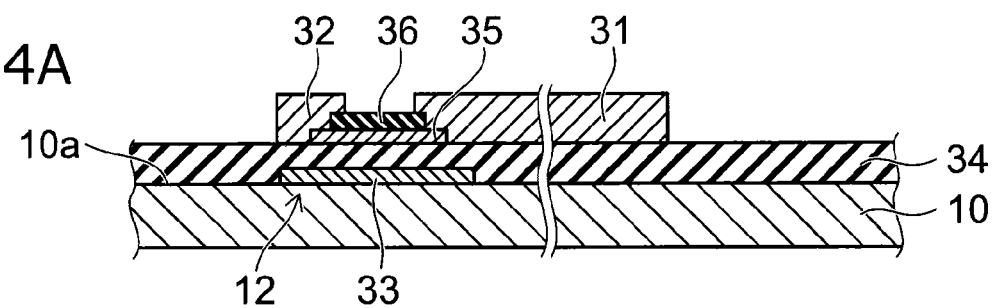
FIG. 4A to FIG. 4D are schematic cross-sectional views illustrating a method for manufacturing the display device according to the first embodiment.

As shown in FIG. 4A, in the manufacture of the display device 110, the thin film transistor 12 is formed on the major surface 10a of the substrate 10. In forming the thin film transistor 12, the gate electrode 33 is formed on the major surface 10a. The gate insulating film 34 is formed on the major surface 10a and the gate electrode 33. The semiconductor film 35 is formed on the gate insulating film 34. The channel protection film 36 is formed on the semiconductor film 35. The first conducting portion 31 and the second conducting portion 32 are formed on the gate insulating film 34, the semiconductor film 35, and the channel protection film 36.

Figure 4B:
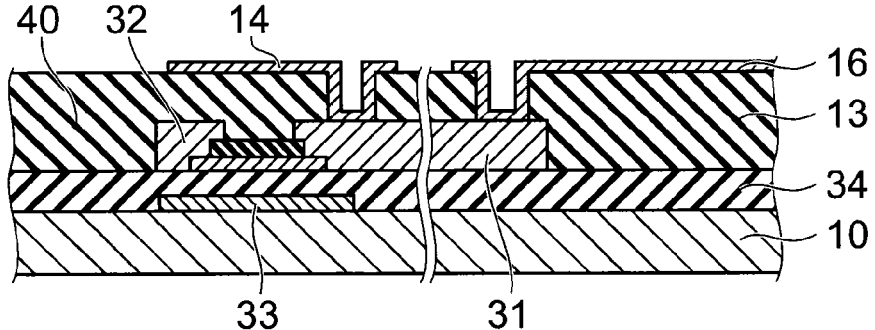

As shown in FIG. 4B, the passivation film 13 is formed on the thin film transistor 12. For example, a $SiO_2$ film to be the passivation film 13 is formed by PE-CVD. The first opening 13a and the second opening 13b are formed on the $SiO_2$ film. The thickness of the passivation film 13 is 200 nm (100 nm or more and 300 nm or less), for example. The hydrogen barrier film 14 and the pixel electrode 16 are formed on the passivation film 13. For example, a Ti film to be the hydrogen barrier film 14 is formed by sputtering, and processed in a predetermined shape to obtain the hydrogen barrier film 14. The thickness of the hydrogen barrier film 14 is 50 nm (20 nm or more and 150 nm or less), for example. An ITO film to be the pixel electrode 16 is formed by sputtering or the like, and processed in a predetermined shape to obtain the pixel electrode 16. The thickness of the pixel electrode 16 is 200 nm (100 nm or more and 200 nm or less), for example. The order of forming the hydrogen barrier film 14 and forming the pixel electrode 16 is optional. In the case where a material used for the pixel electrode 16 is used for the hydrogen barrier film 14, these process steps are simultaneously performed.

Figure 4C:
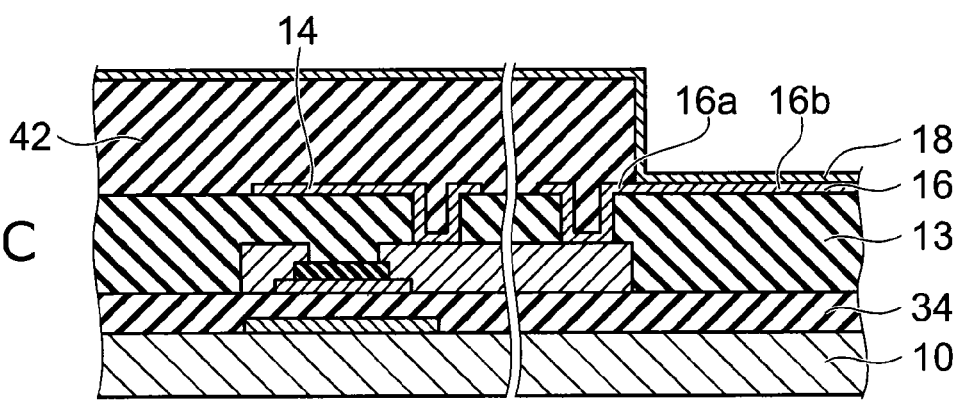

As shown in FIG. 4C, the planarization film 42 is formed on the hydrogen barrier film 14 and the opposing region 16a of the pixel electrode 16. For example, an organic resin to be the planarization film 42 is applied and patterned to obtain the planarization film 42. The organic light emitting layer 18 is formed on the planarization film 42 and the non-opposing region 16b of the pixel electrode 16. The organic light emitting layer 18 is formed by vapor deposition, for example.

Figure 4D:
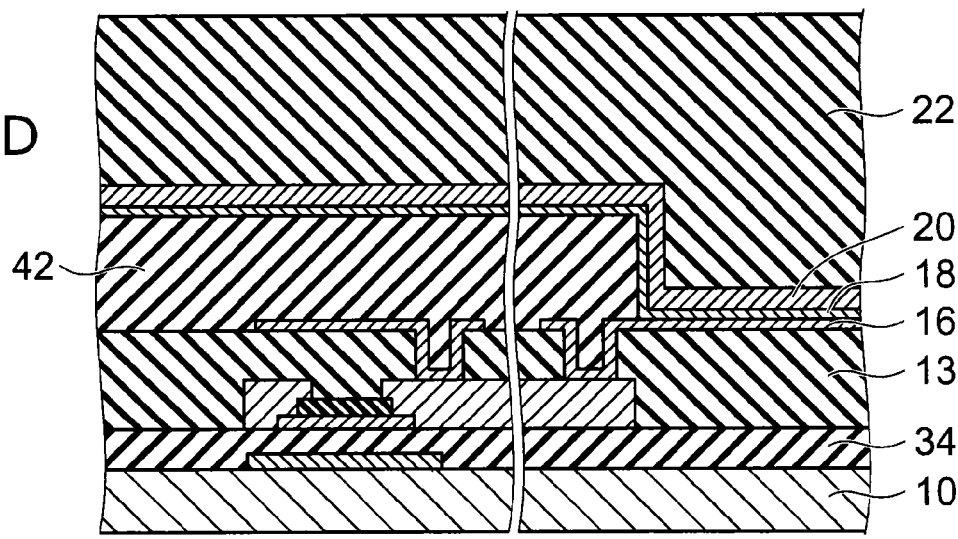

As shown in FIG. 4D, the opposite electrode 20 is formed on the organic light emitting layer 18. For example, a stacked film of a LiF film and an Al film to be the opposite electrode 20 is formed by vapor deposition, and processed in a predetermined shape. The sealing film 22 is formed on the opposite electrode 20. As described above, the display device 110 is fabricated.

Figure 5:
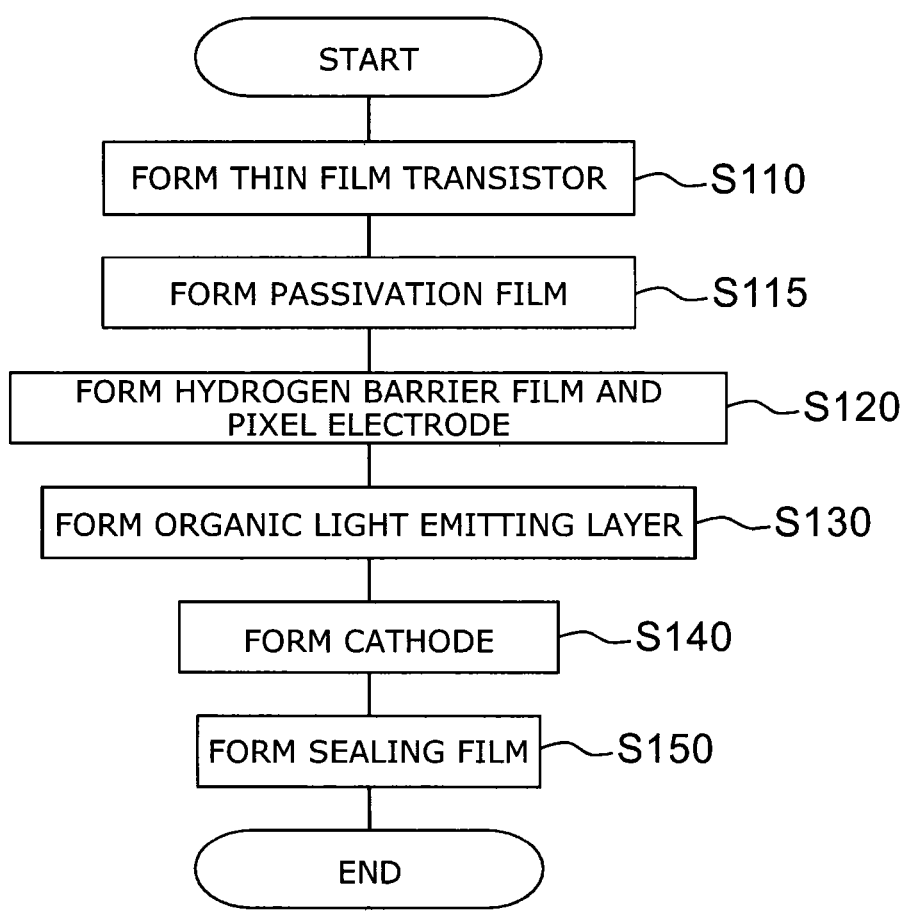
FIG. 5 is a flowchart illustrating a method for manufacturing the display device according to the first embodiment.

FIG. 5 is a flowchart illustrating a method for manufacturing the display device according to the first embodiment.

As shown in FIG. 5, the method for manufacturing the display device 110 includes Step S110 of forming the thin film transistor 12, Step S115 of forming the passivation film 13, Step S120 of forming the hydrogen barrier film 14 and the pixel electrode 16, Step S130 of forming the organic light emitting layer 18, Step S140 of forming the opposite electrode 20, and Step S150 of forming the sealing film 22.

In Step S110, the process described with reference to FIG. 4A is performed, for example. In Step 115 and Step S120, the process described with reference to FIG. 4B is performed, for example. In Step S130, the process described with reference to FIG. 4C is performed, for example. In Step S140 and Step S150, the process described with reference to FIG. 4D is performed, for example.

The process step of forming the thin film transistor 12 (Step S110) can include forming the channel protection film 36 to cover the top surface of the semiconductor film 35.

In the manufacturing method, the hydrogen barrier film 14 can include one of Ti, Ta, TiN, and TaN. The hydrogen barrier film 14 can include an oxide including at least one of In, Zn, Ga, Ti, and Al.

The process step of forming the hydrogen barrier film 14 and the pixel electrode 16 (Step S120) can include electrically connecting the hydrogen barrier film 14 to one of the first conducting portion 31 and the second conducting portion 32 (the source 12S, for example). In the case where the semiconductor film 35 is of an n-type, the process step of forming the hydrogen barrier film 14 and the pixel electrode 16 (Step S120) can include electrically connecting the hydrogen barrier film 14 to the pixel electrode 16.

In the manufacturing method, the semiconductor film 35 can include an oxide semiconductor including at least one of In, Ga, and Zn. The sealing film 22 includes hydrogen of $10^{19}$ atoms/cm$^3$ or more. In this case, the hydrogen barrier film 14 is provided to effectively suppress the fluctuation of the threshold voltage.

Figure 6:
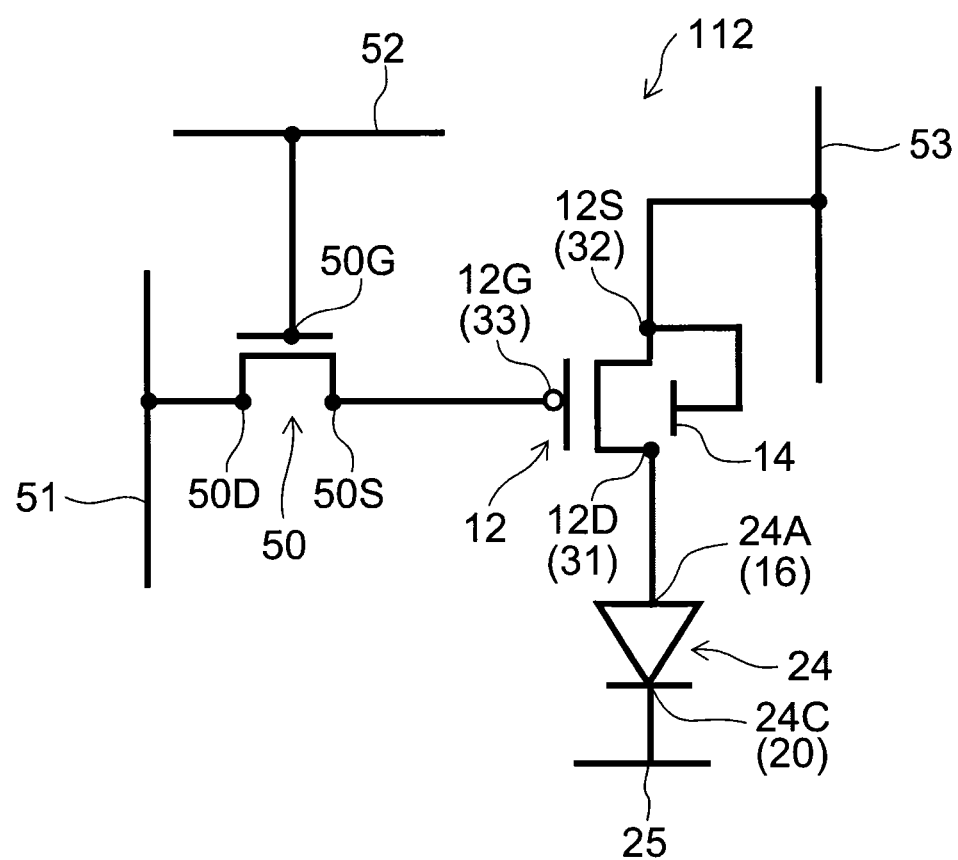
FIG. 6 is an equivalent circuit diagram illustrating the configuration of another display device according to the first embodiment.

FIG. 6 is an equivalent circuit diagram illustrating the configuration of another display device according to the first embodiment.

As shown in FIG. 6, in a display device 112, a semiconductor film 35 of a thin film transistor 12 is of a p-type. A pixel electrode 16 is electrically connected to one of a first conducting portion 31 and a second conducting portion 32. In this example, the pixel electrode 16 is electrically connected to the first conducting portion 31 (a drain 12D). A hydrogen barrier film 14 is connected to the second conducting portion 32 (a source 12S), which is the other of the first conducting portion 31 and the second conducting portion 32. The hydrogen barrier film 14 is electrically connected to a power supply line 53 through the source 12S.

For example, like this example, in the case where the semiconductor film 35 is of a p-type, the process step of forming the hydrogen barrier film 14 and the pixel electrode 16 (Step S120) can include electrically connecting the hydrogen barrier film 14 to the other of the first conducting portion 31 and the second conducting portion 32 (the source 12S is the second conducting portion 32).

Also in the display device 112, since the hydrogen barrier film 14 is provided, the fluctuation of the characteristics of the thin film transistor 12 can be suppressed, and a display device with a high image quality can be provided.

Figure 7:
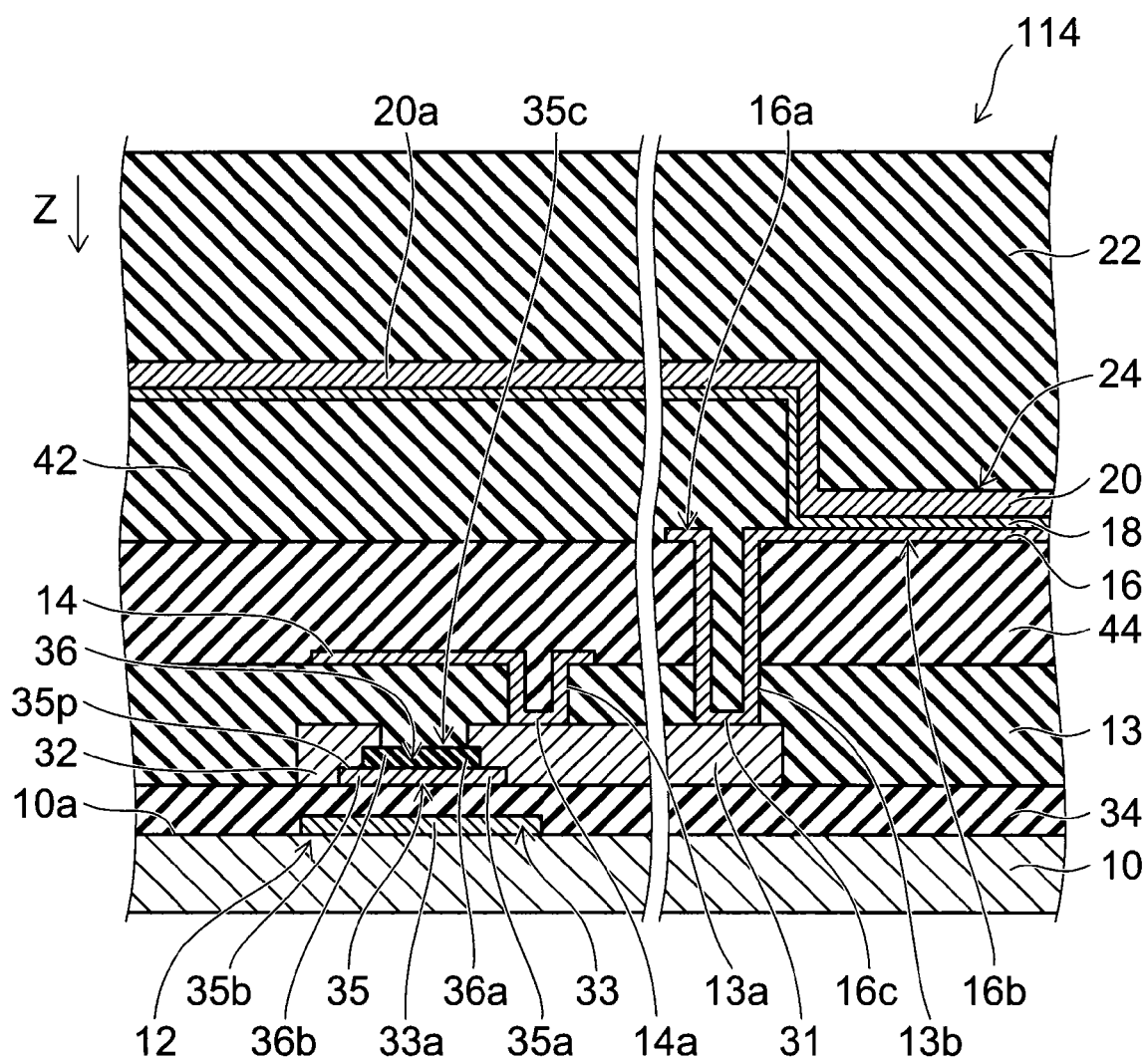
FIG. 7 is a schematic cross-sectional view illustrating the configuration of still another display device according to the first embodiment.

FIG. 7 is a schematic cross-sectional view illustrating the configuration of still another display device according to the first embodiment.

As shown in FIG. 7, a display device 114 further includes a color filter 44. The color filter 44 is provided between a hydrogen barrier film 14 and a planarization film 42, and between a pixel electrode 16 and a passivation film 13. The color filter 44 has a different color for every pixel. For example, the color filter 44 is formed in which one of red, green, and blue color resin films (a color resist, for example) is applied and the color resin film is patterned. The film thickness of the color filter 44 is 2 μm, for example (1 μm or more and 3 μm or less, for example).

As described above, also in the display device 114 provided with the color filter 44 on the hydrogen barrier film 14, a change in the characteristics of the thin film transistor 12 can be suppressed, and a high image quality can be obtained.

The display device 114 can be manufactured as follows, for example.

After forming the thin film transistor 12, the passivation film 13 is formed. A SiO$_2$ film having a thickness of 100 nm or more and 300 nm or less, for example, is formed by PE-CVD as the passivation film 13. A SiN film, or a SiON$_x$ film may be used for the passivation film 13. A Ti film to be the hydrogen barrier film 14 (a thickness of 20 nm or more and 100 nm or less) is further formed by sputtering, for example. This Ti film is processed to obtain the hydrogen barrier film 14. Red, green, and blue color resists are applied and processed to form the color filter 44. The pixel electrode 16 is formed on the color filter 44. The planarization film 42 is formed on the color filter 44 and the pixel electrode 16. An organic light emitting layer 18 and an opposite electrode 20 are sequentially formed on the pixel electrode 16 to form a sealing film 22. As described above, the display device 114 is fabricated.

Second Embodiment

Figure 8A:
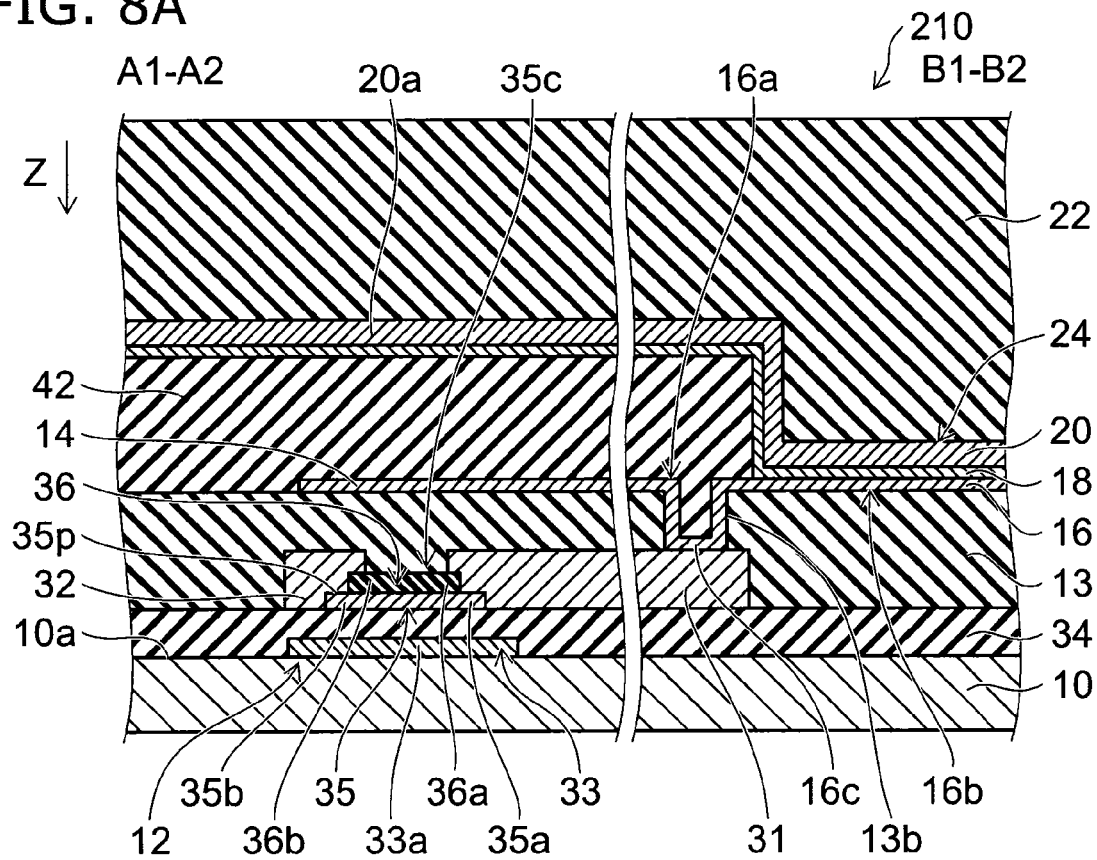
FIG. 8A and FIG. 8B are schematic views illustrating the configuration of a display device according to a second embodiment.
Figure 8B:
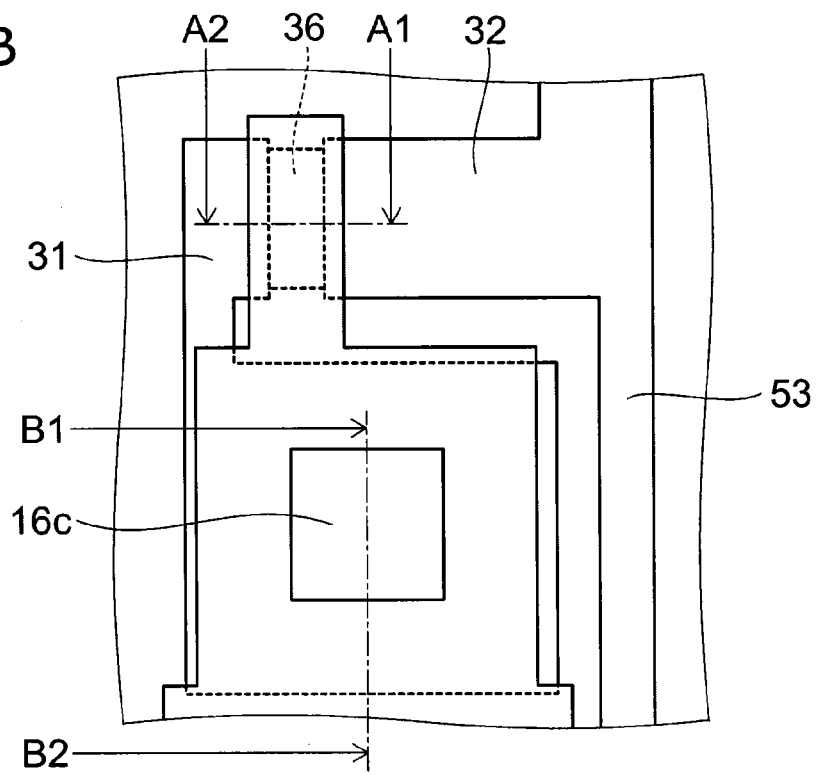

FIG. 8A and FIG. 8B are schematic views illustrating the configuration of a display device according to a second embodiment.

FIG. 8A is a schematic cross-sectional view illustrating a display device 210. FIG. 8B is a schematic plan view illustrating the display device 210.

As shown in FIG. 8A and FIG. 8B, in the display device 210, a material to be a pixel electrode 16 is used for the material of a hydrogen barrier film 14. Namely, the material of the hydrogen barrier film 14 is substantially the same as the material of the pixel electrode 16. In this case, a metal oxide such as ITO, IZO, AZO, IGZO, and ZnO, for example, is used for the hydrogen barrier film 14 and the pixel electrode 16. The hydrogen barrier film 14 continues to the pixel electrode 16.

Also in the display device 210, the hydrogen barrier film 14 is provided to suppress the movement of hydrogen included in the sealing film 22 to the semiconductor film 35 for improving image quality. Moreover, in the display device 210, the hydrogen barrier film 14 and the pixel electrode 16 can be formed simultaneously. Thereby, additional processes can be eliminated, and providing a high productivity.

In this example, the hydrogen barrier film 14 can include an oxide including at least one of In, Zn, Ga, Ti, and Al. These materials are a material used for the pixel electrode 16.

The process step of forming the hydrogen barrier film 14 and the pixel electrode 16 (Step S120) can include forming the hydrogen barrier film 14 using a material to be the pixel electrode 16. The hydrogen barrier film 14 continues to the pixel electrode 16. Thereby a high productivity can be obtained.

Figure 9:
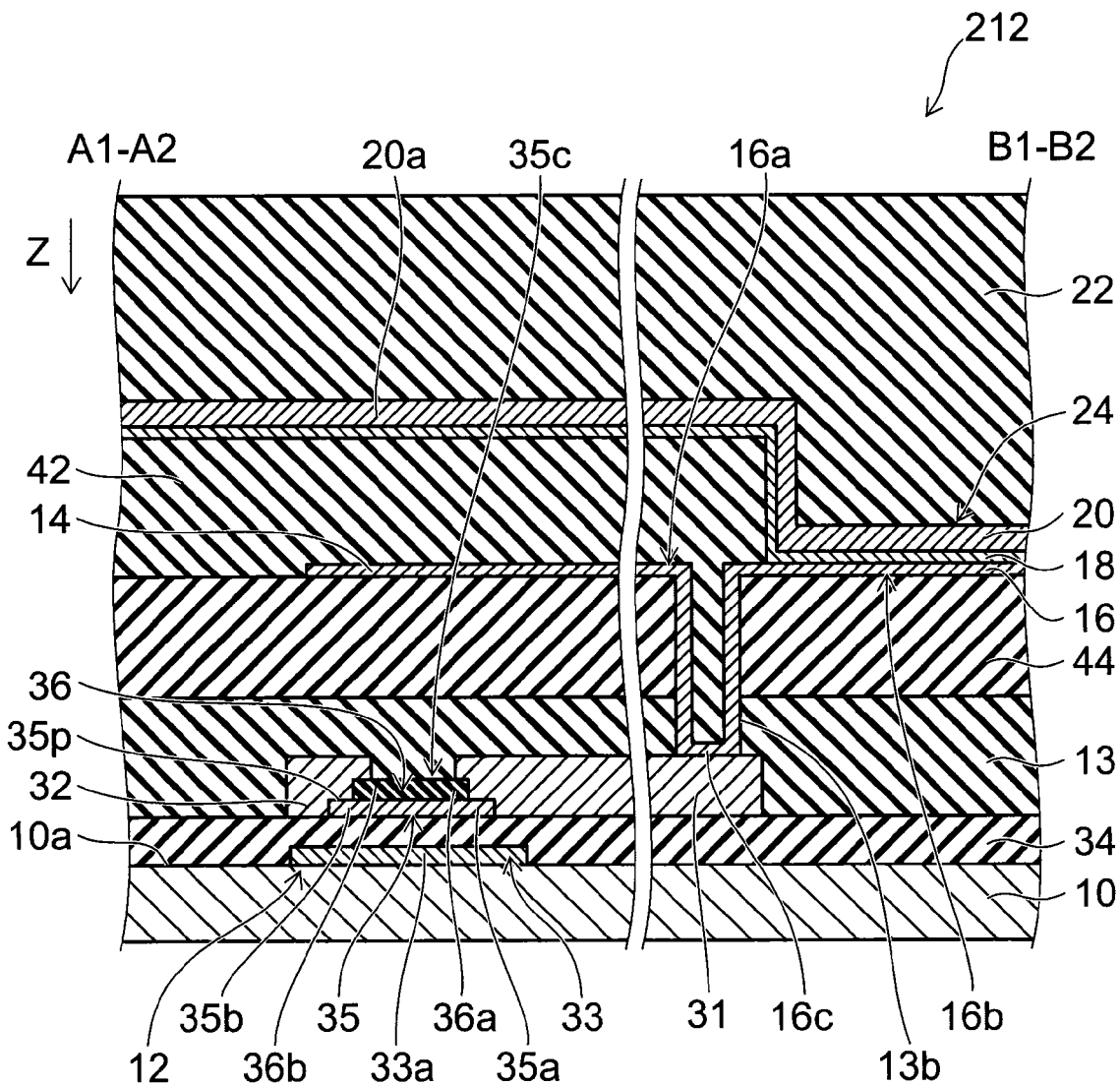
FIG. 9 is a schematic cross-sectional view illustrating the configuration of another display device according to the second embodiment.

FIG. 9 is a schematic cross-sectional view illustrating the configuration of another display device according to the second embodiment.

As shown in FIG. 9, in a display device 212, a pixel electrode 16 and a hydrogen barrier film 14 continuing to the pixel electrode 16 are provided on a color filter 44. Also in the display device 212, the hydrogen barrier film 14 suppresses the movement of hydrogen included in a sealing film 22 to a semiconductor film 35 for improving image quality. Additional processes are also unnecessary, and productivity is also high.

According to the embodiment, a display device with a high image quality can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification of the application, a state in which "a component is provided on another component" includes a state in which a component is directly provided on another component as well as a state in which a component is provided on another component with a different element inserted between the component and another component. A state in which "a component is stacked on another component" includes a state in which a component is stacked on another component to contact each other as well as a state in which a component is stacked on another component with a different element inserted between the component and another component. A state in which "a component opposes another component" includes a state in which a component directly faces another component as well as a state in which a component faces another component with a different element inserted between the component and another component.

As described above, the embodiments of the invention are described with reference to specific examples.

However, the embodiments of the invention are not limited to these specific examples. For example, the specific configurations of the components such as the substrate, the thin film transistor, the passivation film, the hydrogen barrier film, the pixel electrode, the organic light emitting layer, the opposite electrode, the sealing film, the gate electrode, the gate insulating film, the semiconductor film, the first conducting portion, and the second conducting portion included in the display device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all display devices practicable by an appropriate design modification by one skilled in the art based on the display device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising:
    a substrate having a major surface, the substrate being light transmissive;
    a thin film transistor provided on the major surface, the thin film transistor including:
        a gate electrode provided on the major surface;
        a gate insulating film provided on the gate electrode;
        a semiconductor film provided on the gate insulating film, the semiconductor film including a first region, a second region apart from the first region, and a third region provided between the first region and the second region;
        a first conducting portion electrically connected to the first region; and
        a second conducting portion electrically connected to the second region and provided apart from the first conducting portion;
    a passivation film provided on the thin film transistor, the passivation film being insulative;
    a hydrogen barrier film provided on the passivation film and overlapping with the semiconductor film when projected onto a plane parallel with the major surface;
    a pixel electrode electrically connected to one of the first conducting portion and the second conducting portion, the pixel electrode being light transmissive;
    an organic light emitting layer provided on the pixel electrode;
    an opposite electrode provided on the organic light emitting layer; and
    a sealing film provided on the hydrogen barrier film and on the opposite electrode, the sealing film including hydrogen of $10^{19}$ atoms/cm$^3$ or more.

2. The device according to claim 1, wherein the hydrogen barrier film includes one of Ti, Ta, TiN and TaN.

3. The device according to claim 1, wherein the hydrogen barrier film includes an oxide including at least one of In, Zn, Ga, Ti, and Al.

4. The device according to claim 1, wherein the hydrogen barrier film is electrically connected to the one of the first conducting portion and the second conducting portion.

5. The device according to claim 1, wherein
    the semiconductor film is of an n-type, and
    the hydrogen barrier film is electrically connected to the pixel electrode.

6. The device according to claim 1, wherein
    the semiconductor film is of a p-type, and
    the hydrogen barrier film is electrically connected to the other of the first conducting portion and the second conducting portion.

7. The device according to claim 1, wherein the hydrogen barrier film includes a material the same as a material of the pixel electrode.

8. The device according to claim 7, wherein the pixel electrode includes at least one of ITO, IZO, AZO, IGZO, and ZnO.

9. The device according to claim 1, wherein the semiconductor film includes an oxide semiconductor including at least one of In, Ga, and Zn.

10. The device according to claim 1, wherein the opposite electrode extends on the semiconductor film and on the hydrogen barrier film.

11. The device according to claim 1, wherein the substrate includes a resin material and is flexible.

12. The device according to claim 1, wherein
    the gate insulating film is disposed between the gate electrode and the third region.

13. The device according to claim 12, wherein the thin film transistor further includes a channel protection film provided at least on the third region.

14. The device according to claim 1, wherein the opposite electrode includes a metal material.

15. The device according to claim 1, wherein a thickness of the hydrogen barrier film is 20 nm or more and 150 nm or less.

16. The device according to claim 1, further comprising a color filter,
    the passivation film extending between the pixel electrode and the major surface, and
    the color filter being provided between the pixel electrode and the passivation film and on the hydrogen barrier film.

17. The device according to claim 1, further comprising a color filter,
    the passivation film extending between the pixel electrode and the major surface, and
    the color filter being disposed between the pixel electrode and the passivation film and extending between the passivation film and the hydrogen barrier film.

18. A display device comprising:
    a substrate having a major surface, the substrate being light transmissive;
    a thin film transistor provided on the major surface, the thin film transistor including:
        a gate electrode provided on the major surface;
        a gate insulating film provided on the gate electrode;
        a semiconductor film provided on the gate insulating film, the semiconductor film including a first region, a second region apart from the first region, and a third region provided between the first region and the second region;
        a first conducting portion electrically connected to the first region; and
        a second conducting portion electrically connected to the second region and provided apart from the first conducting portion;
    a passivation film provided on the thin film transistor, the passivation film being insulative;
    a hydrogen barrier film provided on the passivation film and overlapping with the semiconductor film when projected onto a plane parallel with the major surface;
    a pixel electrode electrically connected to one of the first conducting portion and the second conducting portion, the pixel electrode being light transmissive;
    an organic light emitting layer provided on the pixel electrode;
    an opposite electrode provided on the organic light emitting layer; and a sealing film provided on the hydrogen barrier film and on the opposite electrode, wherein the hydrogen barrier film includes a material the same as a material of the pixel electrode, and the hydrogen barrier film continues to the pixel electrode.

19. The device according to claim 18, wherein the sealing film includes at least one of a silicon oxide film, a silicon nitride film, and a silicon oxynitride film.

* * * * *